United States Patent
Chen et al.

[11] Patent Number: 6,057,563
[45] Date of Patent: May 2, 2000

[54] LIGHT TRANSPARENT SUPERLATTICE WINDOW LAYER FOR LIGHT EMITTING DIODE

[75] Inventors: Hsi-Ming Chen; Szutsun S. Ou, both of Taipei, Taiwan

[73] Assignee: Lite-on Electonics, Inc., Taipei, Taiwan

[21] Appl. No.: 09/102,823

[22] Filed: Jun. 23, 1998

[51] Int. Cl.⁷ ................................................ H01L 33/00
[52] U.S. Cl. ................. 257/97; 257/13; 257/15; 257/22; 257/79; 257/94; 257/96; 257/103; 257/613; 257/615
[58] Field of Search .................... 257/9, 12, 13, 257/14, 15, 17, 18, 22, 79, 94, 96, 97, 98, 103, 613, 615

[56] References Cited

U.S. PATENT DOCUMENTS 5,989,339  11/1999  Tamamura et al. ............ 117/107

*Primary Examiner*—Jerome Jackson, Jr.
*Assistant Examiner*—Bradley William Baumeister
*Attorney, Agent, or Firm*—Rosenberg, Klein & Lee

[57] ABSTRACT

Disclosed is a light transparent window layer for light transmitting diodes. The light transparent window layer is formed by growing a plurality of AlGaInP superlattice layers such that the uniformity of current distribution within LED chip can be enhanced, and the size of light-emitting area can be increased. The manufacturing process is also simplified.

4 Claims, 3 Drawing Sheets

LIGHT TRANSPARENT SUPERLATTICE WINDOW LAYER FOR LIGHT EMITTING DIODE

BACKGROUND OF THE INVENTION

The present invention relates generally to a light emitting diode (LED), and more particularly, to an LED having a light transparent window layer by which the brightness of the LED can be enhanced with reduced manufacturing cost.

The LED has found wide application in diverse fields such as indicating lamps, display means, and sensors. In view of the efficiency of photon generation, most of LEDs are made of III–V compound semiconductor materials such as GaAs, InP, AlAs and their ternary or quaternary derivatives. For examples, an AlGaInP LED is formed, by successively growing of an n-type AlGaInP layer as a lower optical confinement layer, an AlGaInP layer as an active layer, and a p-type AlGaInP layer as an upper optical confinement layer, over an n-type GaAs substrate. The above LED is further provided with a front contact and a back contact on the top side and bottom side of the LED, respectively.

The above-mentioned upper optical confinement layer is generally of high electrical resistivity due to the requirement of higher band gap to keep it from absorbing light. However, the injected current is hard to spread out to the edge of the LED chip uniformly in case that the LED employs an upper optical confinement layer with high electrical resistivity. The radiation area of the active layer, therefore, is limited; and thus decreases the LED's radiation power and brightness. Moreover, since the confinement layer is not completely transparent, part of the light generated from the active layer are reflected back and absorbed by the absorbing substrate, rather than transmitting out. This process also limits the LED's brightness.

To enhance LED's brightness, a thick semiconductor layer as a transparent window layer has been proposed to cover the top of the LED, with reference to Table 1. However, the manufacturing processes for fabricating the above-mentioned transparent window layer are time consuming and of high cost. Moreover, other techniques involving the process of regrowth also have above drawbacks.

To prevent the problem of light absorption by opaque substrate, a reflecting mirror formed by a distributed Bragg reflector (DBR) is provided over the substrate. Nevertheless, the problem that injected current is hard to spread out to the edge of the LED chip uniformly is not solved satisfactorily in the prior arts. The uniformity of emitting light is accordingly degraded.

SUMMARY OF THE PRESENT INVENTION

The object of the present invention is to provide a LED having a light transparent window layer by which the injected current can be spreaded out to the edge of LED chip and the light can be emitted uniformly.

The another object of the present invention is to provide a LED having a light transparent window layer formed by a superlattice such that the uniformity of current distribution within LED chip can be enhanced. Moreover, since the invention does not require a regrowth step, therefore it simplifies the process and reduces cost.

To achieve the above and other objects of the present invention, here provides an LED with light transparent window layers comprising:

a GaAs substrate with a first metal contact on back side thereof;

a Bragg reflector layer formed upon the substrate;

an AlGaInP confinement layer of a first conductive-type grown upon the Bragg reflector layer;

a conductive AlGaInP active layer grown upon the AlGaInP confinement layer of the first conductive-type;

an AlGaInP confinement layer of a second conductive-type grown upon the AlGaInP active layer, a plurality of conductive GaInP/AlGaInP superlattice layers grown upon the AlGaInP confinement layer of the second conductive-type wherein the energy difference between the first conduction subband and the first valence subband thereof is larger than the energy of photon emitted from the active layer;

an ohmic contact layer grown upon the conductive GaInP/AlGaInP superlattice layers;

a metal contact installed on the top of the ohmic contact layer.

To achieve the above and other objects of the present invention, here provides LEDs with light transparent window layers comprising:

a GaAs substrate with a first metal contact on back side thereof;

a Bragg reflector layer formed upon the substrate;

an AlGaInP confinement layer of a first conductive-type grown upon the Bragg reflector layer;

a conductive AlGaInP active layer grown upon the AlGaInP confinement layer of the first conductive-type;

an AlGaInP confinement layer of a second conductive-type grown upon the AlGaInP active layer;

a plurality of AlGaInP superlattice layers of the second conductive-type grown upon the AlGaInP confinement layer of the second conductive-type wherein the energy difference between the first conduction subband and the first valence subband thereof is larger than the energy of photon emitted from the active layer;

an AlGaInP layer grown upon the AlGaInP superlattice layers of the second conductive-type;

a plurality of AlGaInP superlattice layers of the second conductive-type grown upon the AlGaInP layer wherein the energy difference between the first conduction subband and the first valence subband thereof is larger than the energy of photon emitted from the active layer;

an ohmic contact layer grown upon the AlGaInP superlattice layers of the second conductive-type;

a metal contact installed on top of the ohmic contact layer.

The various objects and advantages of the present invention will be more readily understood from the following detailed description when read in conjunction with the three appended drawings, in which:

DESCRIPTION OF THE PREFERRED EMBODIMENTS

Figure 1:
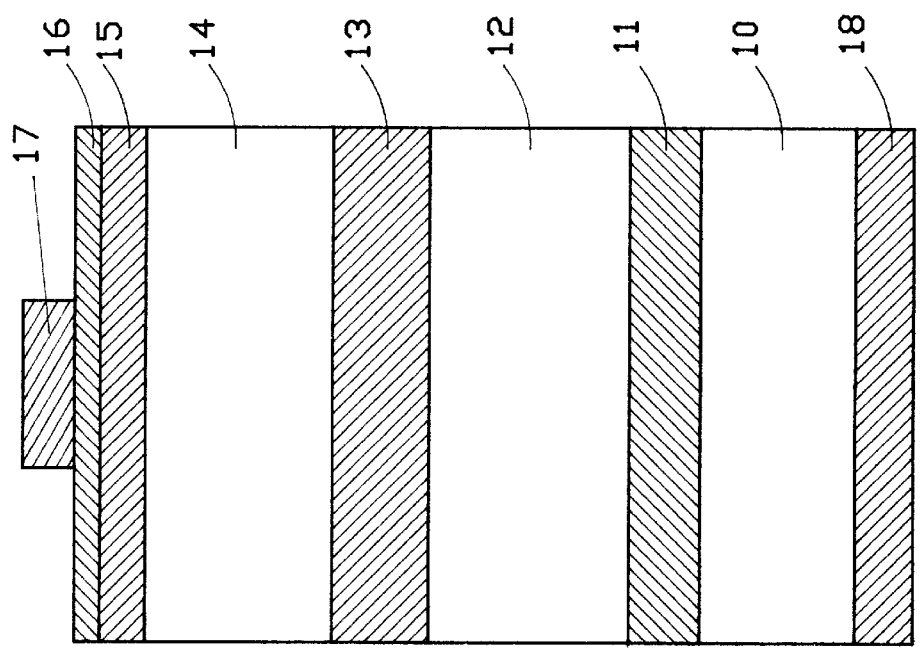
FIG. 1 is a diagram of a cross-sectional view of the LED's light transparent window layers of the first preferred embodiment of the present invention.

As shown in FIG. 1, a diagram of a cross-sectional view of LED's light transparent window layers of the first preferred embodiment of the present invention is shown. In the following, we will describe the structure of brighter LED's light transparent window layers of the first preferred embodiment of the present invention in detail.

The first embodiment of LED with light transparent window according to the present invention comprises:

a GaAs substrate 10 of a first conductive-type;

a Bragg reflector layer 11 consisting of AlAs/GaAs and formed upon the substrate 10;

an AlGaInP confinement layer 12 of the first conductive-type grown upon the Bragg reflector layer 11;

a conductive AlGaInP active layer 13 grown upon the AlGaInP confinement layer 12;

an AlGaInP confinement layer 14 of a second conductive-type grown upon the AlGaInP active layer 13;

a plurality of conductive GaInP/AlGaInP superlattice layers 15 grown upon the AlGaInP confinement layer 14;

an ohmic contact layer 16 of the second conductive-type grown upon the conductive AlGaInP superlattice layer 15;

a front contact 17 formed on top of the ohmic contact layer 16; and a back contact 18 formed on the back side of the substrate 10.

The GaAs substrate 10 is of the first conductive-type with doping concentration larger than $1 \times 10^{17}/cm^3$. The Bragg reflector layer 11 has 10–20 AlAs/GaAs pairs. Based on the emitting wavelength of 6450 Å, the GaInP/AlGaInP (AlGaAs/AlGaInP) superlattice layer 15 can be designed to have 30 Å/30 Å well/barrier width, and 10–15 periods. The ohmic contact layer 16 of the second conductive-type can employ GaAs or GaP with doping concentration larger than $1 \times 10^{17}/cm^3$.

Figure 2:
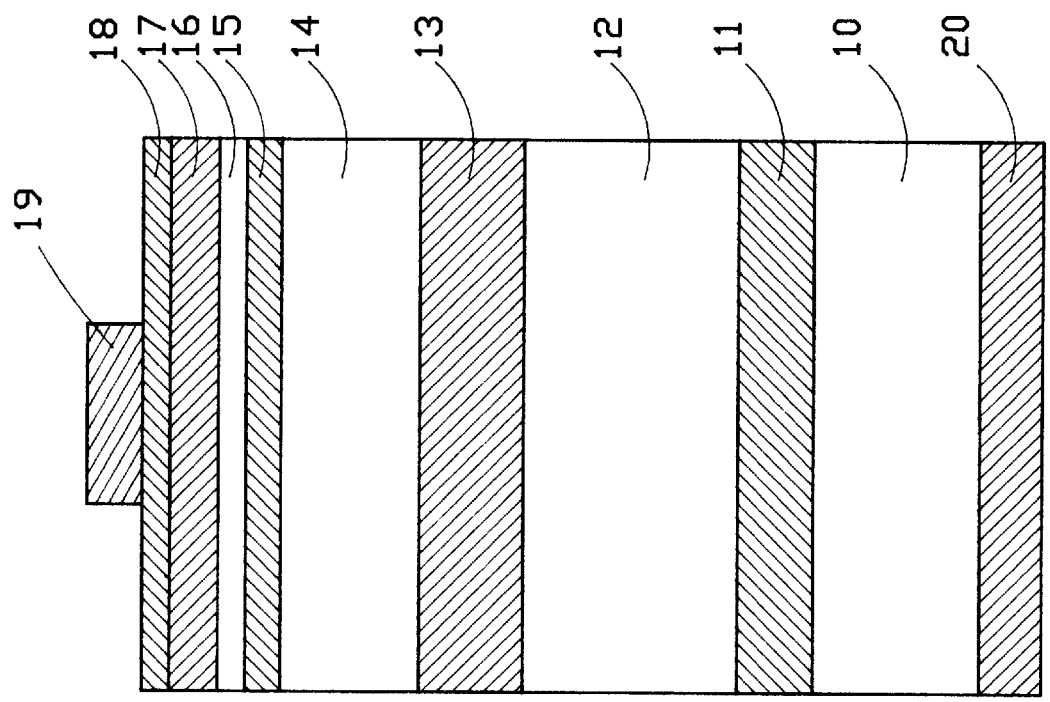
FIG. 2 is a diagram of a cross-sectional view of the LED's light transparent window layers of the second preferred embodiment of the present invention.

As shown in FIG. 2, the second preferred embodiment the LED with light transparent window according to the present invention comprises:

a GaAs substrate 10 of a first conductive-type;

a Bragg reflector layer 11 consisting of AlAs/GaAs and formed upon the substrate 10;

an AlGaInP confinement layer 12 of the first conductive-type grown upon the Bragg reflector layer 11;

a conductive AlGaInP active layer 13 grown upon the AlGaInP confinement layer 12;

an AlGaInP confinement layer 14 of a second conductive-type grown upon the AlGaInP active layer 13;

a plurality of GaInP/AlGaInP superlattice layer 15 of the second conductive-type grown upon the AlGaInP confinement layer 14;

an AlGaInP layer 16 grown upon the AlGaInP superlattice layer 15 of second conductive-type;

a GaInP/AlGaInP (AlGaAs/AlGaInP) superlattice layer 17 of the second conductive-type grown upon the AlGaInP layer 16;

an ohmic contact layer 18 of the second conductive type grown upon the GaInP/AlGaInP (AlGaAs/AlGaInP) superlattice layer 17;

an ohmic contact electrode 19 formed upon the ohmic contact layer 18; and a back contact 20 formed on the back side of the substrate 10.

The GaAs substrate 10 is of the first conductive-type with doping concentration larger than $1 \times 10^7/cm^3$. The Bragg reflector layer 11 has 10–20 AlAs/GaAs pairs. Based on the emitting wavelength of 6450 Å, the GaInP/AlGaInP (GaAlAs/AlGaInP) superlattice layer 17 can be designed to have 30 Å/30 Å well/barrier width, and 10–15 periods. The ohmic contact layer 18 of the second conductive-type can employ GaAs or GaP with doping concentration larger than $1 \times 10^{17}/cm^3$.

For the embodiments, the GaInP/AlGaInP (AlGaAs/AlGaInP) Superlattice layers can be grown to one or several pairs to form a light transparent widow which can enhance the uniformity of current distribution within LED chip while not absorbing light emitted from the active layer. For different wavelength band (yellow or orange), the transparency can be preserved as much as the energy difference between the first conduction subband and the first valence subband thereof is larger than the energy of photon emitted from the active layer. Moreover, the employment of superlattice layers as the transparency window can increase the uniformity of current distribution within LED chip, thus increasing LED's brightness.

Figure 3:
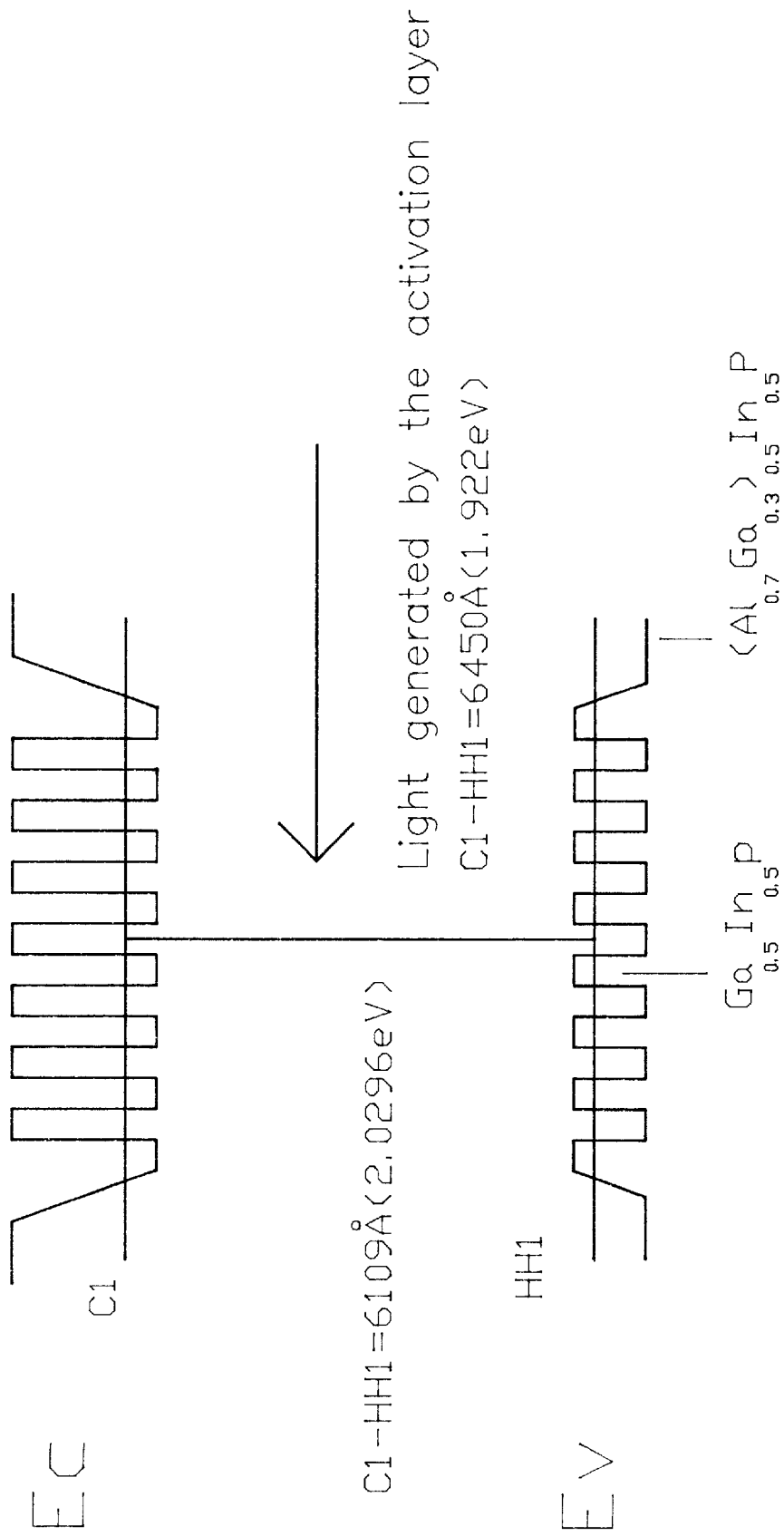
FIG. 3 is a diagram of energy bands of LED's light transparent window layers of a preferred embodiment of the present invention.

As shown in FIG. 3, the barrier width/well widths of the GaInP/AlGaInP (GaAlAs/AlGaInP) superlattice layers are 30 Å/30 Å. The energy difference between the first conduction subband and the first valence subband thereof (C1—HH1) is calculated to be 2.0296 eV, that is larger than the photon energy of 1.922 eV of the emitting light (6450 Å). Therefore, the superlattice layers will not absorb the light emitted from the active layer. Following this argument, the superlattice layers can be made transparent to emitted light of various wavelength as long as the subband energy difference (C1—HH1) thereof is prudently designed to exceed the emitted photon energy.

Moreover, the superlattice layers can provide a higher density of state which will facilitate the coupling of electron wave function. This is beneficial to the enhancement of current uniformity in LED chip.

More specifically, the device parameters of the superlattice layer influence the subband energy difference (C1—HH1) and the coupling of electron wave function in following manner:

(1) The difference between band gap of barrier and well (depend on the composition of AlGaInP), and the width of barrier/well decide whether the energy difference (C1—HH1) of the superlattice exceeds the emitted photon energy. That is, whether the superlattice layers are transparent to the emitted photon.

(2) The width of barrier/well decide whether the coupling of electron wave is high enough to ensure the uniformity of current distribution within LED chips.

To sum up, the LED with light transparent window according to the present invention can provide a bright and uniform luminance by enabling current to flow uniformly through the entire LED chip and increasing the transparency of the window layer.

Although the present invention has been described with reference to the two preferred embodiments thereof, it will be understood that the invention is not limited to the details thereof. Various substitutions and modifications have suggested in the foregoing description, and other will occur to those of ordinary skill in the art. All such substitutions and modifications are intended to be embraced within the scope of the invention as defined in the appended claims.

What is claimed is:

1. A light-emitting diode with light transparent window layers, comprising:

a conductive semiconductor substrate with a first electrode on back side thereof;

an AlGaInP confinement layer of a first conductive-type grown upon said conductive semiconductor substrate;

an AlGaInP active layer grown upon said AlGaInP confinement layer of said first conductive-type;

an AlGaInP confinement layer of a second conductive-type grown upon said AlGaInP active layer;

a plurality of conductive GaInP/AlGaInP superlattice layers grown upon said AlGaInP confinement layer of said the second conductive-type wherein the energy difference between the first conduction subband and the first valence subband thereof is larger than the energy of photon emitted from said active layer;

an ohmic contact layer grown upon said conductive GaInP/AlGaInP superlattice layer; and a second electrode installed on the top of said ohmic contact layer.

2. The LED's light transparent window layers as claimed in claim 1, wherein said conductive semiconductor substrate is a GaAs substrate.

3. The LED's light transparent window layers as claimed in claim 1, wherein a Bragg reflector layer is provided between said the conductive semiconductor substrate and said AlGaInP confinement layer of said the first conductive type.

4. The LED's light transparent window layers as claimed in claim 1, wherein said the second electrode is a metal electrode.

* * * * *